(12) United States Patent
Singh et al.

(10) Patent No.: US 9,598,280 B2
(45) Date of Patent: Mar. 21, 2017

(54) ENVIRONMENTAL SENSOR STRUCTURE

(71) Applicant: Freescale Semiconductor, Inc., Austin, TX (US)

(72) Inventors: Akhilesh K. Singh, Austin, TX (US); Dwight L. Daniels, Phoenix, AZ (US); Darrel R. Frear, Phoenix, AZ (US); Stephen R. Hooper, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 1 day.

(21) Appl. No.: 14/537,529

(22) Filed: Nov. 10, 2014

(65) Prior Publication Data
US 2016/0130136 A1  May 12, 2016

(51) Int. Cl.
*H01L 23/29* (2006.01)
*H01L 23/31* (2006.01)
*H01L 23/26* (2006.01)
*B81C 1/00* (2006.01)

(52) U.S. Cl.
CPC .......... *B81C 1/00309* (2013.01); *H01L 23/26* (2013.01); *H01L 23/29* (2013.01); *H01L 23/3135* (2013.01); *B81B 2201/0264* (2013.01); *B81B 2207/012* (2013.01)

(58) Field of Classification Search
None
See application file for complete search history.

(56) References Cited

U.S. PATENT DOCUMENTS

| 4,732,042 | A | * | 3/1988 | Adams | G01L 19/0084 338/4 |
| 5,097,841 | A | | 3/1992 | Moriuchi et al. | |
| 5,948,991 | A | * | 9/1999 | Nomura | B29C 45/14639 438/53 |
| 6,214,634 | B1 | * | 4/2001 | Osajda | G01L 19/0645 338/4 |
| 6,260,417 | B1 | * | 7/2001 | Watanabe | G01L 19/147 73/754 |
| 6,441,503 | B1 | * | 8/2002 | Webster | G01L 19/0645 257/417 |
| 6,512,255 | B2 | * | 1/2003 | Aoki | G01L 19/147 257/254 |

(Continued)

FOREIGN PATENT DOCUMENTS

JP  2001153746 A * 6/2001

OTHER PUBLICATIONS

Hooper, R. et al., Media Compatibility for IPS PRT Pressure Sensors, Freescale Semiconductor AN3728, Rev. 1, Jul. 2008.

(Continued)

*Primary Examiner* — Hoang-Quan Ho

(57) ABSTRACT

A device in which an electronic circuit positioned within a cavity of a package housing is encased by a bubble restrictor material, with a media resistant material overlaying the bubble restrictor material. The bubble restrictor material functions to inhibit the formation and growth of moisture-related bubbles within the material, including at the interfaces of the material and surfaces within the package housing. The media resistant material is resistant to physical and chemical alterations by media within an external environment to which the device is exposed. The media resistant material and bubble resistant material function to transfer a sensed characteristic of the media to the electronic circuit.

20 Claims, 4 Drawing Sheets

(56) References Cited

U.S. PATENT DOCUMENTS

| | | | |
|---|---|---|---|
| 6,844,632 B2* | 1/2005 | Shiono | G01L 19/147 257/684 |
| 7,078,796 B2* | 7/2006 | Dunn | G01L 19/0069 257/690 |
| 7,216,545 B2* | 5/2007 | Uchida | G01L 19/0627 73/705 |
| 7,462,919 B2* | 12/2008 | Engling | B81B 7/0058 257/419 |
| 7,464,603 B2* | 12/2008 | Bauer | G01L 19/0069 257/678 |
| 7,749,797 B2* | 7/2010 | Bauer | H01L 24/83 257/433 |
| 7,956,451 B2* | 6/2011 | Carberry | H01L 23/057 257/668 |
| 8,794,074 B2* | 8/2014 | Ochs | B81B 7/0058 73/708 |
| 9,146,170 B2* | 9/2015 | Wen | G01L 19/14 |
| 9,190,339 B2* | 11/2015 | Chan | H01L 23/3107 |
| 2001/0028072 A1* | 10/2001 | Aoki | G01L 19/147 257/254 |
| 2002/0180019 A1 | 12/2002 | Saito et al. | |
| 2004/0021209 A1* | 2/2004 | Shiono | G01L 19/147 257/682 |
| 2004/0089922 A1 | 5/2004 | Gerber et al. | |
| 2006/0137458 A1* | 6/2006 | Uchida | G01L 19/0627 73/715 |
| 2007/0222005 A1* | 9/2007 | Schmitt | B81B 7/0051 257/414 |
| 2008/0173097 A1 | 7/2008 | Bauer et al. | |
| 2013/0113054 A1* | 5/2013 | Yow | H01L 23/3107 257/414 |
| 2014/0146509 A1* | 5/2014 | Hooper | G01L 19/0654 361/809 |
| 2015/0221572 A1* | 8/2015 | Chan | H01L 23/3107 257/734 |

OTHER PUBLICATIONS

Wu, J. et al., Novel Bi-Layer Conformal Coating for Reliability Without Hermeticity MEMS Encapsulation, IEEE Transactions on Electronics Packing Manufacturing, vol. 22, No. 3, Jul. 1999, pp. 195-201.
English Abstract of Japanese Publication No. 2001-116639. Publication date Apr. 27, 2001.
English Abstract of Japanese Publication No. 2001-050836. Publication date Feb. 23, 2001.
English Abstract of Japanese Publication No. 2001-153746. Publication date Jun. 8, 2001.
English Abstract of Japanese Publication No. 2005-326338. Publication date Nov. 24, 2005.
English Abstract of JP3858577 (B2); Dec. 13, 2006.
English Abstract of EP0360286 (A2); Mar. 28, 1990.
English Abstract of JP3229812 (B2); Nov. 19, 2001.
English Abstract of JPH0949822 (A); Feb. 18, 1997.
English Abstract of JP2525433 (B2); Aug. 21, 1996.

* cited by examiner

ENVIRONMENTAL SENSOR STRUCTURE

TECHNICAL FIELD

Embodiments of the subject matter described herein relate generally to electronic devices with cavity-type packages filled with a material to protect circuitry within the cavity, and methods of their manufacture.

BACKGROUND

An electronic device configured as an environmental sensor may include a sensor integrated circuit ("IC") die, enclosed within the cavity of a cavity-type package. To enable the sensor IC die to sense particular characteristics of the environment, the package may include an opening (e.g., through the package lid) that permits exposure of the sensor IC die to the external environment. In some types of sensors, a protective material (e.g., a gel) may be disposed inside the cavity and covering the sensor IC die, in order to protect the sensor IC die from otherwise potentially destructive exposure to the external environment. In some types of devices, the quantity of gel disposed within the cavity is selected so that an air gap is present between the surface of the gel and the package's lid. If, for example, the sensor IC die is configured to sense environmental pressure, during such a pressure sensing operation, the force of air pressure impinging upon the exposed surface of the gel is translated through the gel to a sensing element (e.g., a transducer) implemented in the pressure sensor IC die. The pressure sensor IC die transducer then generates an electrical signal indicative of the pressure imposed. A non-limiting example of such a pressure sensor transducer is a piezo-resistive transducer ("PRT") pressure sensor.

In some cases, moisture entering the package cavity may result in reliability and/or accuracy issues for such sensor devices. For example, moisture may diffuse through the relatively-permeable, protective gel and lodge on a surface of the package cavity. Under certain conditions (e.g., at elevated temperatures, such as during a reflow process, and/or after exposure to significant changes in pressure within the external environment in which the sensor device is implemented), the moisture may transition to a gaseous state, producing bubbles at an interface between the gel and a surface within the package cavity. Those bubbles may thereafter migrate to the exposed surface of the gel. When the bubbles are sufficiently large and/or prolific, they may significantly deform the surface of the gel. The bubbles also may migrate to the surface of the sensor IC die. Either of these conditions, in turn, may produce a mechanical offset and, thus, inaccuracy in the sensor measurements (e.g., a false pressure output) that may be obtained by the device. In extreme cases, bubble-caused gel surface deformation may compromise the functionality of the sensor device.

DETAILED DESCRIPTION

Figure 1:
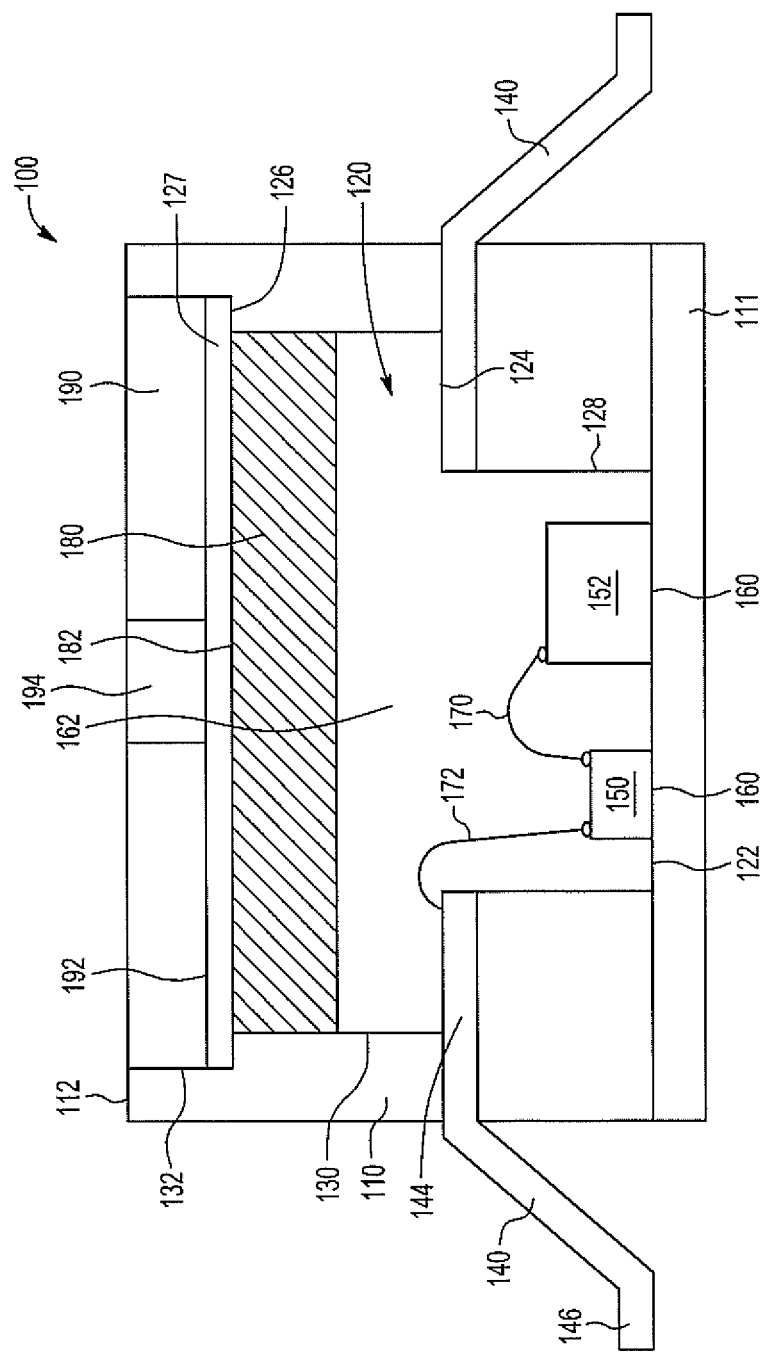
FIG. 1 is a cross-sectional, side view of an electronic device with a cavity-type, material-filled package, in accordance with various embodiments.

Aspects of the present invention generally provide a device in which an electronic circuit positioned within a cavity of a package is encased by a bubble restrictor material, with a media resistant material overlaying the bubble restrictor material.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding Technical Field, Background, or the following Detailed Description.

Embodiments include electronic devices with cavity-type, material-filled packages, and methods of their manufacture. Within the cavity of a package housing, one or more electronic circuit devices, which may be packaged as a semiconductor IC die (e.g., a pressure sensor IC die and an associated control IC die) are placed within the cavity (e.g., mounted over a mounting area of the cavity bottom surface, or any other surface within the cavity (e.g., using a die attach material)). According to embodiments, a bubble restrictor material is applied (e.g., deposited) within the cavity so that it covers over the one or more electronic circuit devices. In embodiments, the bubble restrictor material may be deposited within the cavity so that it fills all, or substantially all, of the cavity, and encases any devices within the cavity. As used herein, a "bubble restrictor material" may be any material that restricts, or impedes, the formation and growth of moisture-caused bubbles. In embodiments, the bubble restrictor material is compatible with the silicon technology utilized to construct the one or more electronic circuit devices.

After deposition of the bubble restrictor material, a media resistant material is then deposited over the bubble restrictor material. The media resistant material comprises a material (e.g., a curable elastomer gel, polymer, or other material) that is resistant to chemical or physical alteration caused by interaction or contact with the media (e.g., air pressure, external gases or chemicals, and/or other environmental characteristics) of the external environment. According to embodiments, the media resistant material may be permeable to moisture, and a top surface of the media resistant material may be exposed to environmental conditions (e.g., to allow the device to sense ambient pressure) of the media of the external environment in which the sensor device is installed and implemented. Accordingly, moisture may impinge upon and permeate through the media resistant material. In embodiments, and as mentioned above, the bubble restrictor material restricts bubbles from forming (and growing should any bubbles do form), within the space occupied by the bubble restrictor material, which includes the inside surfaces of the cavity and surfaces on any electronic devices mounted within the cavity, particularly at elevated temperatures at which the moisture may undergo a phase change to a gaseous state. Accordingly, in devices having features of the various embodiments, bubbles are not likely to form and migrate to the top, exposed surface of the media resistant material, in contrast with conventional devices that lack such a bubble restrictor material. Accordingly, a device implemented in accordance with the various embodiments described herein is less likely to experience deformation of the exposed surface as a result of bubble formation and migration, thus avoiding potential mechanical offsets in the device or more serious issues that such bubbles otherwise may cause. However, embodiments of the present disclosure as described hereinafter are not limited to application of the bubble restrictor material and the media resistant material within the device; layers of other materials may also be included. Furthermore, a plurality of layers of either or both of the bubble restrictor material and the media resistant material within the device is within a scope of embodiments of the present disclosure.

FIG. 1 is a cross-sectional, side view of an electronic device 100 with a cavity-type, material-filled package, in accordance with various embodiments of the present disclosure. For example, device 100 may be a pressure sensor, an accelerometer, another type of transducer, or another type of device that may benefit from features of the various embodiments (e.g., a device in which bubble formation is not desired). Device 100 includes a package housing 110 with a cavity 120 formed through a top surface 112 of the package housing 110. According to embodiments, the cavity 120 is defined by a cavity bottom surface 122, one or more bonding shelves 124, a lid attach surface 126 if a lid 190 is implemented, lower sidewalls 128 extending between the cavity bottom surface 122 and the bonding shelves 124, intermediate sidewalls 130 extending between the bonding shelves 124 and the lid attach surface 126, and upper sidewalls 132 extending between the lid attach surface 126 and the package top surface 112. Note that embodiments of the present disclosure are not limited to the foregoing configuration of various surfaces, sidewalls, and shelves.

The package housing 110 may comprise a rigid and relatively porous material (e.g., a cured molded compound, such as a thermoplastic material), and accordingly, the various surfaces 122, 124, 126, 128, 130, 132 defining cavity 120 may include small imperfections. Such imperfections may allow moisture to be trapped at the interfaces between certain ones of the surfaces 122, 124, 126, 128, 130 and the material overlying those surfaces. However, implementation of the various embodiments ensures that such moisture does not adversely affect the performance of the device 100.

The cavity bottom surface 122 may be a top surface of a core substrate 111 upon which the device 100 is mounted. The core substrate may be integral with the package housing 110, or a separate part made from a material different from the package housing. Exemplary materials include, but are not limited to, a polyphenylene sulfide plastic, an epoxy molding compound, and a printed circuit board ("PCB") laminate substrate.

One or more conductive structures 140 (referred to as "leads" herein) may extend through the package housing 110 to provide for transmission of electrical signals and/or voltage references (e.g., power and ground) between electronic devices (circuits) 150, 152 (e.g., implemented in the form of IC dies) within the cavity 120 and an exterior of the package housing 110. For example, each of the lead(s) 140 may include a first portion 144 and a second portion 146, which are electrically coupled. Each first portion 144 is accessible within the cavity 120, and each second portion 146 is exposed to an exterior of the package housing 110, allowing for physical and electrical connection of the device 100 to another device, printed circuit board, or other substrate included in a larger electrical system (not shown). The first portions 144 of the leads 140 may be exposed at the bonding shelves 124 within the cavity 120, thus providing a bonding area (e.g., for connection of bondwires) located between the cavity bottom surface 122 and the top surface 112 of the package housing 110.

Within the cavity 120, one or more electronic devices 150, 152 are placed within the cavity 120 (e.g., mounted over a mounting area of a surface within the cavity 120, such as the cavity bottom surface 122 (e.g., using a die attach material 160)). As used herein, the "mounting area" of a cavity surface (e.g., the cavity bottom surface 122) is defined as the combined area(s) on the cavity surface over which the electronic devices 150, 152 are mounted. The mounting area may include a single area (e.g., over which a single electronic device is mounted) or multiple, abutting, or spatially separated areas (e.g., over which multiple electronic devices are mounted). In other words, the "mounting area" of a cavity surface is defined as the footprint of all electronic devices mounted over the cavity surface. In contrast, the "non-mounting area" of a cavity surface (e.g., the cavity bottom surface 122) is defined as an entire remainder of the cavity surface, or all portions of the cavity surface over which the electronic devices are not mounted.

According to embodiments, the electronic device 150 may comprise a sensor circuit (e.g., a pressure sensor IC die, an accelerometer IC die, or another type of transducer) configured to produce sensor signals indicating a sensed characteristic of the media of an external environment in which the device 100 is installed and implemented. For example, the media may be any chemical compound, in liquid, solid, or gas form that interacts with the sensor circuit(s) in the device 100. According to embodiments, the electronic device 152 may comprise a control circuit configured to provide control signals to the sensor circuit, receive the sensor signals from the sensor circuit, and send signals representative of the sensor signals to external circuitry (not illustrated), such as through the leads 140.

For example, the sensor circuit may be implemented as a micro-electromechanical system ("MEMS") device, although the sensor circuit may be implemented using other technologies, as well. In embodiments in which the electronic device 150 comprises a pressure sensor IC die, for example, the electronic device 150 is configured to produce an electrical signal having characteristics that indicate the magnitude of environmental pressure applied to the electronic device 150 (e.g., the signal indicates a capacitive, resistive, or other change in the electronic device 150 due to a change in pressure applied to the electronic device 150). For example, such a pressure sensor IC die may be implemented as a Wheatstone bridge-type sensor, a piezo-resistive transducer ("PRT"), or piezo-resistive strain gauge (e.g., a plurality of strain gauges interconnected to form a Wheatstone bridge), a capacitive sensor (e.g., including a diaphragm and a pressure cavity, which form a variable capacitor), an electromagnetic sensor (e.g., a device configured to measure displacement of a diaphragm by means of changes in inductance), a piezoelectric sensor (e.g., a device that exploits the piezoelectric effect in a material to measure strain), an optical sensor (e.g., a device that senses pressure based on physical change of an optical fiber), and so on. When the device 100 also includes a control IC die as a second electronic device 152, the control IC die may be configured to receive signals from external circuitry (e.g., through leads 140), including control signals and voltage reference signals (e.g., power and ground), provide control signals to the sensor circuit (e.g., input voltages), receive signals from the sensor circuit indicating electrically-sensed environmental conditions, condition, filter, or otherwise process the sensor circuit signals, and send signals indicating the processed signals to the external circuitry. Exemplary devices, which may take advantage of the inventive concepts disclosed herein, include, but are not limited to, manifold absolute pressure ("MAP") sensors, barometric absolute pressure ("BAP") sensors, and tire pressure monitor sensors ("TPMS").

As described previously, the one or more electronic devices 150, 152 may be mounted to a mounting area of a cavity surface (e.g., using a die attach material 160). In addition, according to embodiments, a bubble restrictor material 162 is deposited within the cavity 120 so that it covers (i.e., encases) the one or more electronic devices 150, 152. For example, if the one or more electronic devices 150, 152 are mounted to the cavity bottom surface 122, the bubble restrictor material 162 will be deposited within the cavity 120 to a fill level whereby the bubble restrictor material 162 covers the one or more electronic devices 150, 152, and covers all, or substantially all, of the non-mounting area of the cavity bottom surface 122. According to embodiments, the bubble restrictor material 162 may be deposited within the cavity 120 to a fill level so that it extends partially, or completely up, one or more of the sidewalls of the cavity 120.

According to embodiments, the modulus of elasticity of the bubble restrictor material 162 may be sufficiently high so that the material 162 functions as a mechanical restrictor of the formation and growth of bubbles within the material 162 (e.g., of moisture-caused bubbles at the interfaces between one or more of the cavity surfaces 122, 124, 126, 128, 130, and/or surfaces of the electronic devices 150, 152).

The die attach material 160 and the bubble restrictor material 162 may include one or more polymer adhesives, for example, although other materials having sufficient die attach and bubble restriction properties, respectively, may be used as well. According to embodiments, the bubble restrictor material 162 may be permeable to moisture, and accordingly the bubble restrictor material 162 may allow moisture to pass through it and settle on one or more of the cavity surfaces 122, 124, 126, 128, 130 under certain circumstances. However, in such instances, the bubble restrictor material will restrict, or inhibit, further growth of such bubbles.

Exemplary materials that may be utilized for the bubble restrictor material include, but are not limited to, gels, curable gels, polymeric gels, thermoplastics, thermosets, silicones, fluoropolymers, fluorocarbons, fluorosilicones, fluoroelastomers, perfluoroelastomers, perfluoropolyethers, and polymeric hybrid/composite structures including gels and other polymers. In certain embodiments, such a bubble restrictor material can transfer pressure from an external environment to a pressure monitoring device encased within the gel, and has sufficient mechanical properties (e.g., high modulus) to impede the formation and growth of a bubble (such as at interfaces between the various surfaces within the cavity and the material) in a moisture environment when there is a decrease in pressure within the environment. For example, one such material is di-methyl silicone gel, which possesses a sufficiently high modulus to restrict or inhibit the formation and growth of such bubbles.

A plurality of conductive connectors 170, 172 may be connected between the electronic devices 150, 152 and the first portions 144 of the lead(s) 140. For example, the connectors 170 may include bond pads and bondwires connected between the electronic devices 150, 152 (e.g., between a sensor circuit IC die and a control IC die), and the connectors 172 may include bond pads and bondwires connected between one or more of the electronic devices 150, 152 and the leads 140 (e.g., between the control IC die and the leads 140 at the bonding area).

A media resistant material 180 is deposited over the bubble restrictor material 162. The media resistant material 180 may completely cover the bubble restrictor material 162, in embodiments. Such a media resistant material 180 is compatible with the media of the external environment so that it can successfully transfer one or more sensed characteristics of the external environment to the sensor circuit(s) within the electronic devices 150, 152. However, the media may at one time or another contain a corrosive element or composition that is not compatible with the bubble restrictor material 162 or any of the elements of the sensor circuit (for example, a corrosive that has the potential to dissolve, or be absorbed by the bubble restrictor material 162, corrupt the elements or surfaces of the electronic device IC dies, or lead to wire-bond corrosion or breakage). Thus, the media resistant material 180 comprises a material (e.g., a curable elastomer gel, polymer, or other material) that is resistant to chemical or physical alteration caused by interaction or contact with the media of the external environment. Exemplary materials include, but are not limited to, polymeric materials, polymeric gels, fluoropolymers, fluorocarbons, fluoroelastomers, perfluoroelastomers, perfluoropolyethers, and fluorosilicones. Depending on the chemical architecture, the aforementioned materials may have varied degrees of chemical resistance towards acids (organic and inorganic), bases, amines, amides, alcohols, halogens, esters, hydrocarbons, halogenated hydrocarbons, ethers, ketones, aldehydes, and other aliphatic, aromatic, and heterocyclic compounds.

The thicknesses of the bubble restrictor material 162 and the media resistant material 180 each may be in a range of about 10 to about 75 microns, for example, although each may be thinner or thicker, as well. The bubble restrictor material 162 and the media resistant material 180 each may be deposited within the cavity 120 in the form of a curable elastomer gel, polymer, or other material.

In embodiments, the media resistant material and the bubble restrictor material may comprise the same or a similar material composition. However, according to some embodiments, the media resistant material 180 may have a relatively lower modulus of elasticity, when compared with the modulus of elasticity of the bubble restrictor material 162. More particularly, the modulus of elasticity of the media resistant material 180 may be sufficiently low that the media resistant material 180 is not particularly restrictive of bubble formation due to moisture that may infiltrate or be present within the media resistant material 180. However, both the media resistant material 180 and the bubble restrictor material 162 may include moisture-permeable materials. Accordingly, moisture impinging upon the surface 182 of the media resistant material 180 may permeate through both the media resistant material 180 and the bubble restrictor material 162, settling on one or more of the cavity surfaces 122, 124, 126, 128, 130, or surfaces of the electronic devices 150, 152. However, even at temperatures at which such moisture may transition to a gaseous state, the bubble restrict or material 162 is configured to restrict bubbles from forming or growing.

According to embodiments, the media resistant material 180 has a top surface 182 positioned below the lid attach surface 126, so that an air gap 127 is present between the media resistant material 180 and a lid 190 that is attached to the package housing 110. In embodiments, the lid 190 is attached to the lid attach surface 126. For example, the lid 190 may be seated on the lid attach surface 126, which may extend around an entire perimeter of the cavity 120 below the top surface 112 of the package housing 110. In some embodiments, the device 100 may not include a distinct lid attach surface 126, and the package housing 110 may instead may accommodate attachment of a lid to the package top surface 112 (i.e., the package top surface 112 functions as the lid attach surface).

In embodiments, the lid 190 includes one or more openings 194, which allow for exposure of the cavity 120 (or more particularly the top surface 182 of the media resistant material 180) to an exterior of the device 100 (i.e., to a media of the external environment). The air gap 127 is present between the top surface 182 of the media resistant material 180 and a bottom surface 192 of the lid 190. The air gap 127 allows at least a portion of the top surface 182 of the media resistant material 180 to be exposed to the media, allowing the electronic devices 150, 152 to measure such environmental characteristics. By implementing the features of the various embodiments, bubbles that otherwise may affect the accuracy of such measurements are restricted from forming.

An entirety of the top surface 182 of the media resistant material 180 may be exposed to the external environment in order to enable sensing of one or more characteristics of the media of the environment external to the device 100, allowing the electronic devices 150, 152 to measure such environmental characteristics. Nevertheless, the media resistant material 180 and the bubble restrictor material 162 are configured so that they satisfactorily transfer a sensed characteristic (e.g., force or pressure) of the media to a sensing element in the electronic devices 150, 152.

Various modifications may be made to device 100, while still facilitating incorporation of the various inventive features. For example, although a cavity 120 having a particular geometrical configuration is depicted in the figures and described herein, in conjunction with various embodiments, it is to be understood that embodiments of devices may have differently configured cavities. In addition, although the figures depict a cavity 120 that is rectangular in shape when viewed from the top (e.g., as in FIG. 4), other embodiments may include a cavity having a different geometric shape.

Figure 2:
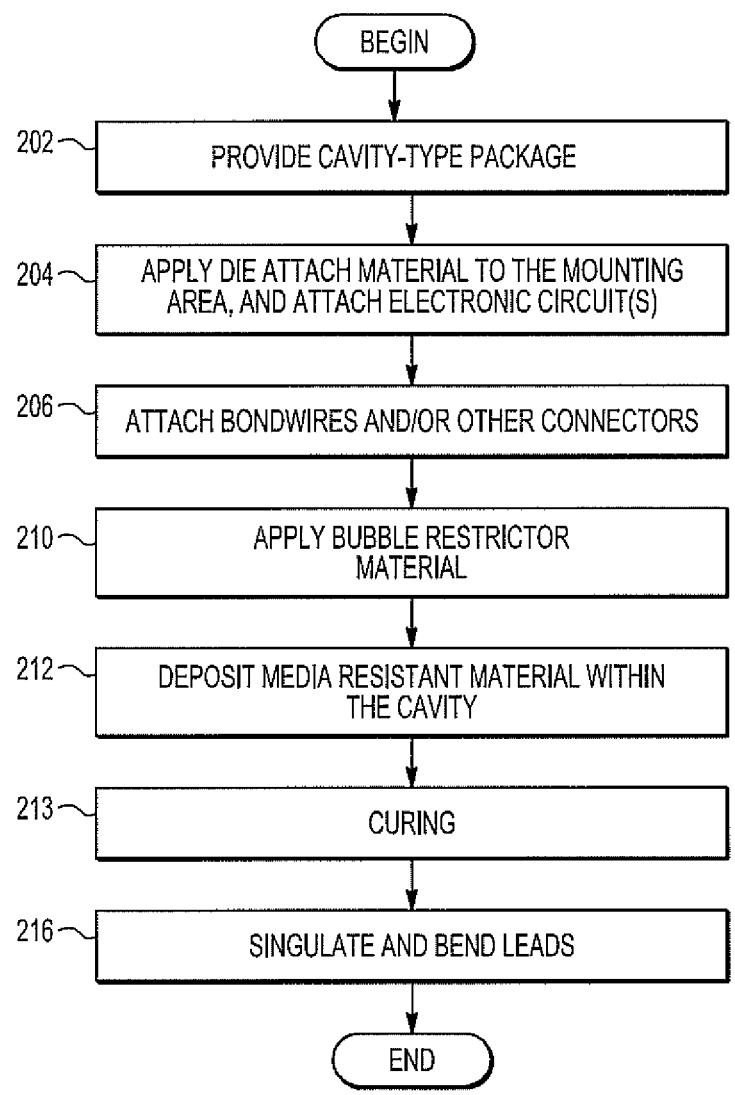
FIG. 2 illustrates a flow diagram depicting manufacturing of an electronic device with a cavity-type, material-filled package, in accordance with various embodiments.

FIG. 2 illustrates a flow diagram depicting manufacturing of an electronic device with a cavity-type, material-filled package (e.g., device 100, FIG. 1), in accordance with various embodiments. Although FIG. 2 depicts the manufacture of only a single device, multiple instances of such a device may be manufactured in parallel. More specifically, for example, a single device may correspond to one cell within an array of multiple cells of a leadframe, where each cell corresponds to an instance of the device being manufactured, and the multiple devices are manufactured in parallel. Some or all of the electrical signal leads of the device (e.g., leads 140, FIG. 1) may be coupled via various sacrificial features of the leadframe, and those sacrificial features may be removed during later manufacturing stages (e.g., during a process of singulating the devices). Such a process facilitates parallel manufacturing of multiple electronic devices, and the below described embodiments include both singular and parallel manufacturing processes.

In accordance with process block 202, manufacturing of the device 100 may begin by providing a cavity-type package with a package housing 110 forming a cavity 120 and including one or more leads 140. Various materials may be utilized for the cavity 120, including, but not limited to, a thermoplastic material. As previously indicated, leads 140 may form portions of one cell of an array of cells of a leadframe, where the cells are interconnected by sacrificial features, not illustrated. The leadframe may then be placed in a forming mold having a corresponding array of mold pattern cells, where each pattern cell in the mold corresponds to the shape of the package housing 110. With the leads 140 appropriately aligned within each pattern cell in the mold, molding compound may be provided within the mold pattern cells and cured. The cavity 120 of the package housing 110 may be created during the molding process, or may be created thereafter. According to embodiments, the cavity 120 may be defined by a cavity bottom surface 122, one or more bonding shelves 124, a lid attach surface 126, lower sidewalls 128 extending between the cavity bottom surface 122 and the bonding shelves 124, intermediate sidewalls 130 extending between the bonding shelves 124 and the lid attach surface 126, and upper sidewalls 132 extending between the lid attach surface 126 and the package top surface 112. However, note that inventive aspects disclosed herein are not limited to a package having this particular configuration of sidewalls, shelves, etc.

One or more electronic devices or circuits (e.g., electronic devices 150, 152) are then placed within the cavity 120. Various processes may be performed to attach the one or more electronic devices or circuits to the package housing 110 and to apply (e.g., deposit) the bubble restrictor material 162 within the cavity 120. In accordance with process block 204, a die attach material 160 may be applied (e.g., deposited) on a surface of the cavity 120 (e.g., within one or more mounting areas of the cavity bottom surface 122). One or more electronic devices 150, 152 are then placed on the die attach material 160, resulting in the attachment of the electronic devices 150, 152 to the cavity surface over the corresponding mounting area(s).

In accordance with process block 206, bond pads, bondwires, and other connectors may be attached (e.g., wire bonded) between the electronic devices 150, 152 and the leads 140. For example, referring also to FIG. 4, which illustrates a top view of the device 100, a plurality of bondwires 170, 172 are connected between the electronic devices 150, 152 and portions of the leads 140 that are exposed within the cavity 120 at the bonding area (e.g., portions 144). For example, bondwires 170 may be connected between a first electronic device 150 (e.g., a sensor circuit IC die) and a second electronic device 152 (e.g., a control circuit IC die), and bondwires 172 may be connected between the second electronic device 152 and the leads 140 (e.g., between the control circuit IC die and the leads 140). Although FIG. 4 depicts a device that includes eight leads 140 extending from two sides of the device 100, embodiments of a device may include more or fewer leads extending from more or fewer sides of the device.

Figure 4:
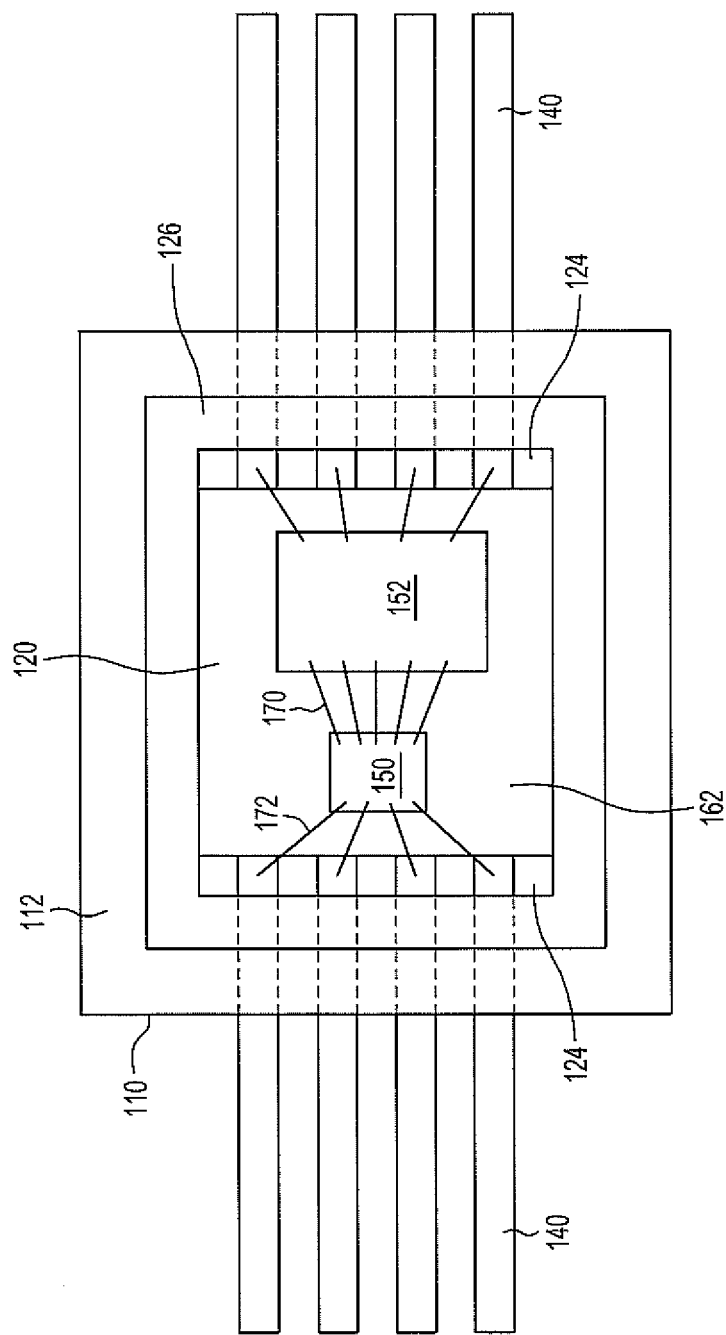
FIG. 4 illustrates a top view (without a lid shown) of the electronic device of FIG. 1 in accordance with various embodiments.

As the top view of FIG. 4 shows, the lid attach shelf 126 may extend around the entire perimeter of the cavity 120 in embodiments. In contrast, the bonding shelves 124 (and corresponding exposed portions of the leads 140 within the cavity 120) may be provided along fewer than all sides of the cavity 120. For example, in embodiments, as depicted in FIG. 4, the bonding shelves 124 and cavity-exposed portions of the leads 140 may be provided along only two sides of the cavity 120. In some embodiments, bonding shelves and leads may be provided along fewer (i.e., one) or more (e.g., three, four, or more) sides of the cavity 120 and device.

In accordance with process block 210, a bubble restrictor material 162 may be applied (e.g., deposited) into the cavity 120. According to embodiments, the bubble restrictor material 162 may be applied partially or completely up the lower sidewalls 128, the one or more bonding shelves 124, and the intermediate sidewalls 130. In embodiments, the bubble restrictor material 162 may be deposited within the cavity 120 to a fill level so that the bubble restrictor material 162 covers an entirety of the one or more electronic devices 150, 152. The bubble restrictor material 162 may be applied so that it partially or wholly covers the bondwires 170, 172. Nevertheless, the bubble restrictor material 162 is deposited within the cavity to a sufficient fill level so that it satisfactorily restricts, or inhibits, formation and growth of bubbles, and so that it satisfactorily transfers sensed environmental characteristics from the media.

In accordance with process block 212, a media resistant material 180 may be deposited over the bubble restrictor material 162. In some embodiments, the media resistant material 180 completely covers the bubble restrictor material 162, thus also encompassing the electronic devices 150, 152 and the bondwires 170, 172. According to some embodiments, the media resistant material 180 has a top surface 182 positioned below the lid attach surface 126. As previously noted, other types of materials or layers may also be included before or after application of the bubble restrictor material 162 and the media resistant material 180.

In accordance with process block 213, the media resistant material 180 and/or the bubble restrictor material 162 may be cured, if necessary. Curing of the bubble restrictor material 162 may be performed before application of the media resistant material 180. Curing may be performed utilizing any well-known process appropriate for the materials comprising either or both of the media resistant material 180 and the bubble restrictor material 162, such as curing of polymeric gels at high temperatures (e.g., approximately 150° C.).

In accordance with process block 216, the device 100 may be singulated by removing sacrificial features (not shown) of a leadframe to which leads 140 are coupled. In order to complete the manufacturing process, the leads 140 thereafter may be bent or otherwise configured for attachment of the device 100 to an external device, circuit board, or other substrate (not illustrated).

Figure 3:
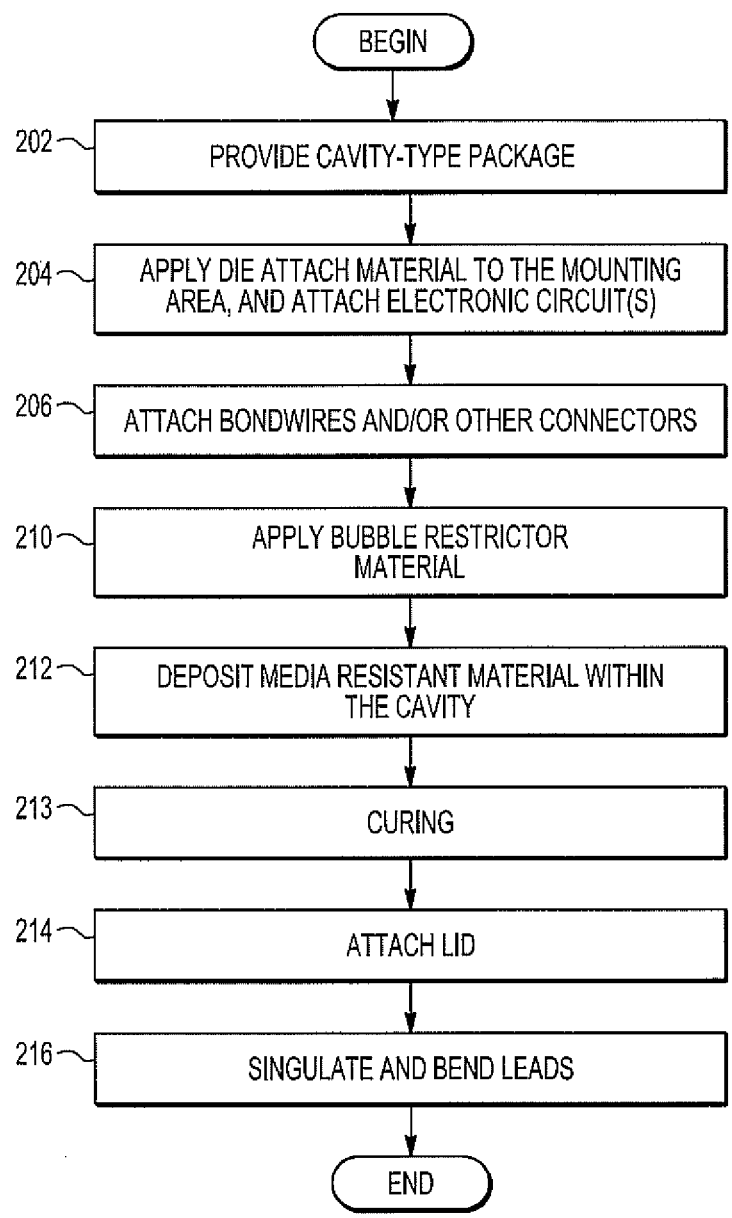
FIG. 3 illustrates a flow diagram depicting manufacturing of an electronic device with a cavity-type, material-filled package, in accordance with various embodiments.

FIG. 3 illustrates a flow diagram depicting a manufacturing process similar to the one described with respect to FIG. 2, except that it implements attachment of a lid 190 to the device 100. Process blocks 202, 204, 206, 210, 212, and 216 in FIG. 3 may be implemented in a similar manner as the corresponding process blocks previously described with respect to FIG. 2. In accordance with process block 214, the lid 190 may be attached to a lid attach surface 126. The lid 190 may be comprised of a same or similar material as the cavity 120, or another material, such as a metal (e.g., stainless steel). According to embodiments, the lid 190 includes one or more openings 194 that allow for exposure of the cavity 120 (or more particularly the top surface 182 of the media resistant material 180) to a media of an external environment of the device 100. An air gap 127 may be present between the top surface 182 of the media resistant material 180 and a bottom surface 192 of the lid 190.

Aspects of the present invention disclose a device comprising a package housing with a cavity, one or more electronic circuits disposed within the cavity, a bubble restrictor material within the cavity encasing the one or more electronic circuits, and a media resistant material disposed within the cavity over the bubble restrictor material, wherein the media resistant material and the bubble restrictor material are configured to transfer to the one or more electronic circuits a sensed characteristic of a media of an environment external to the package housing of the device. The bubble restrictor material may have a sufficiently high modulus of elasticity so that the bubble restrictor material functions as a restrictor of bubble formation and growth at an interface between the bubble restrictor material and surfaces within the cavity. The device may further comprise a die attach material affixing the one or more electronic circuits to a surface of the cavity, wherein the bubble restrictor material covers all or substantially all of the surface of the cavity and fills up a volume in the cavity so that it completely encases the one or more electronic circuits. The one or more electronic circuits may include a first electronic circuit configured to produce sensor signals indicative of the sensed characteristic of the media. The first electronic circuit may be a pressure sensor, an accelerometer, or a transducer. The one or more electronic circuits may further include a second electronic circuit electrically coupled to the first electronic circuit, wherein the second electronic circuit is configured to provide control signals to the first electronic circuit, receive the sensor signals from the first electronic circuit, and send signals representative of the sensor signals to external circuitry. The device may further comprise a plurality of conductive structures, each having first and second portions that are electrically coupled, wherein each first portion is accessible within the cavity and each second portion is exposed to an exterior of the package housing; and a plurality of connectors coupled between the one or more electronic circuits and the first portions of the plurality of conductive structures. The bubble restrictor material may comprise fluoropolymers, fluorocarbons, fluorosilicones, fluoroelastomers, perfluoroelastomers, perfluoropolyethers, or a di-methyl silicone gel. The device may further comprise a lid coupled to the package housing over the cavity, wherein an air gap is present within the cavity between the lid and the media resistant material, wherein the lid includes an opening between top and bottom surfaces of the lid so that a surface of the media resistant material is exposed to the media. The bubble restrictor material may be configured to inhibit formation and growth of moisture-induced bubbles at an interface between the bubble restrictor material and a surface within the cavity. The media resistant material may be configured to be resistant to chemical or physical alteration caused by interaction or contact with the media of the external environment. The media resistant material may comprise a cured fluorosilicone gel or a cured perfluoropolyether gel.

Aspects of the present invention disclose a device comprising a package housing with an internal cavity, wherein the internal cavity is partially defined by a cavity bottom surface that includes a mounting area and a non-mounting area, a sensor circuit attached to the cavity bottom surface over the mounting area, a bubble restrictor material disposed within the internal cavity to a fill level so that the bubble restrictor material at least encases the sensor circuit, and a media resistant material disposed within the internal cavity over the bubble restrictor material, wherein the media resistant material and the bubble restrictor material are configured to transfer to the sensor circuit a characteristic of a media of an environment external to the package housing. The device may further comprise a die attach material over the mounting area, wherein the die attach material affixes the sensor circuit to the mounting area, wherein the bubble restrictor material occupies all or substantially all of a volume defined by surfaces of the internal cavity from the non-mounting area of the cavity bottom surface to the fill level. The bubble restrictor material may have a sufficiently high modulus of elasticity so that the bubble restrictor material functions as a restrictor of moisture-caused bubble formation and growth at an interface between the bubble restrictor material and the surfaces of the internal cavity, wherein the media resistant material is configured to be resistant to chemical or physical alteration caused by interaction or contact with the media of the external environment.

Aspects of the present invention disclose a method for manufacturing an electronic device that includes a package housing with a cavity, the method comprising placing an electronic circuit within the cavity, filling the cavity with a bubble restrictor material to a fill level so that the bubble restrictor material completely encases the electronic circuit, and disposing a media resistant material into the cavity and over the bubble restrictor material. The method may further comprise attaching a lid over the cavity so that it defines an air gap between a bottom surface of the lid and a surface of the media resistant material, wherein the lid includes an opening between top and bottom surfaces of the lid so that the surface of the media resistant material is exposed to media from an environment external to the package housing. The method may further comprise curing the bubble restrictor material and the media resistant material after each has been disposed within the cavity. After curing, the bubble restrictor material may have a sufficiently high modulus of elasticity so that the bubble restrictor material functions as a restrictor of moisture-caused bubble formation and growth at an interface between the bubble restrictor material and the surfaces of the internal cavity. After curing, the media resistant material may be configured to be resistant to chemical or physical alteration caused by interaction or contact with the media of the external environment. The method may further comprise electrically coupling the electronic circuit to a conductive lead that passes through a surface of the cavity and is physically accessible outside of the package housing.

Within this disclosure, the singular forms "a," "an," and "the" include plural referents unless the context clearly dictates otherwise. As used herein, the term "and/or" when used in the context of a listing of entities, refers to the entities being present singly or in combination. Thus, for example, the phrase "A, B, C, and/or D" includes A, B, C, and D individually, but also includes any and all combinations and subcombinations of A, B, C, and D.

As used herein with respect to an identified property or circumstance, "substantially" refers to a degree of deviation that is sufficiently small so as to not measurably detract from the identified property or circumstance. The exact degree of deviation allowable may in some cases depend on the specific context.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a defacto equivalent of any other member of the same list solely based on their presentation in a common group without indications to the contrary.

Any steps recited in any method or process claims may be executed in any order and are not limited to the order presented in the claims.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
   a package housing with a cavity;
   one or more electronic circuits disposed within the cavity;
   a bubble restrictor material within the cavity encasing the one or more electronic circuits; and
   a media resistant material permeable to moisture and disposed within the cavity over the bubble restrictor material, wherein the media resistant material and the bubble restrictor material are configured to transfer to the one or more electronic circuits a sensed characteristic of a media of an environment external to the package housing of the device, wherein the bubble restrictor material is configured to inhibit formation and growth of moisture-induced bubbles at an interface between the bubble restrictor material and a surface within the cavity.

2. The device as recited in claim 1, wherein the bubble restrictor material is configured with a sufficiently high modulus of elasticity so that the bubble restrictor material functions as a restrictor of bubble formation and growth at an interface between the bubble restrictor material and surfaces within the cavity at temperatures at which moisture may transition to a gaseous state.

3. The device as recited in claim 1, further comprising:
   a die attach material affixing the one or more electronic circuits to a surface of the cavity, wherein the bubble restrictor material covers all or substantially all of the surface of the cavity and fills up a volume in the cavity so that it completely encases the one or more electronic circuits and the surface of the cavity to which the one or more electronic circuits are affixed.

4. The device as recited in claim 1, wherein the one or more electronic circuits includes a first electronic circuit configured to produce sensor signals indicative of the sensed characteristic of the media.

5. The device as recited in claim 1, wherein the first electronic circuit is selected from a group consisting of a pressure sensor, an accelerometer, and a transducer.

6. The device as recited in claim 1, wherein the bubble restrictor material is a di-methyl silicone gel.

7. The device as recited in claim 1, further comprising:
   a lid coupled to the package housing over the cavity, wherein an air gap is present within the cavity between the lid and the media resistant material, and the lid includes an opening between top and bottom surfaces of the lid so that a surface of the media resistant material is exposed to the media.

8. The device as recited in claim 1, wherein the media resistant material is configured to be resistant to chemical or physical alteration caused by interaction or contact with the media of the external environment.

9. A device comprising:
   a package housing with an internal cavity, wherein the internal cavity is partially defined by a cavity bottom surface that includes a mounting area and a non-mounting area, wherein the sensor circuit includes a first electronic circuit configured to produce sensor signals indicative of the sensed characteristic of the media;
   a sensor circuit attached to the cavity bottom surface over the mounting area;

a bubble restrictor material disposed within the internal cavity to a level so that the bubble restrictor material at least encases the sensor circuit;

a media resistant material permeable to moisture and disposed within the internal cavity over the bubble restrictor material, wherein the media resistant material and the bubble restrictor material are configured to transfer to the sensor circuit a characteristic of a media of an environment external to the package housing; and a die attach material over the mounting area, wherein the die attach material affixes the sensor circuit to the mounting area, wherein the bubble restrictor material occupies all or substantially all of a volume defined by surfaces of the internal cavity from the non-mounting area of the cavity bottom surface to the fill level, wherein the bubble restrictor material has a sufficiently high modulus of elasticity so that the bubble restrictor material functions as a restrictor of moisture-caused bubble formation and growth at an interface between the bubble restrictor material and the surfaces of the internal cavity and the sensor circuit, wherein the media resistant material is configured to be resistant to chemical or physical alteration caused by interaction or contact with the media of the external environment.

10. The device as recited in claim 9, wherein the bubble restrictor material is selected from a group consisting of fluoropolymers, fluorocarbons, fluoroelastomers, and perfluoroelastomers.

11. The device as recited in claim 9, further comprising a lid coupled to the package housing over the internal cavity, wherein an air gap is present within the internal cavity between the lid and the media resistant material, and the lid includes an opening between top and bottom surfaces of the lid so that a surface of the media resistant material is exposed to the media.

12. The device as recited in claim 1, wherein the bubble restrictor material is permeable to moisture.

13. The device as recited in claim 1, wherein the media resistant material has a relatively lower modulus of elasticity than the bubble restrictor material.

14. The device as recited in claim 13, wherein the media resistant material is not restrictive of bubble formation due to moisture infiltrating or present within the media resistant material.

15. The device as recited in claim 7, wherein the media resistant material completely covers the bubble restrictor material.

16. The device as recited in claim 1, wherein the package housing is permeable to moisture.

17. The device as recited in claim 9, wherein the bubble restrictor material is permeable to moisture, wherein the bubble restrictor material is configured to restrict the moisture-caused bubble formation at elevated temperatures at which the moisture permeated within the bubble restrictor material would typically undergo a phase change to a gaseous state.

18. The device as recited in claim 17, wherein the media resistant material is not restrictive of bubble formation due to moisture infiltrating or present within the media resistant material.

19. The device as recited in claim 18, wherein the bubble restrictor material is configured so that moisture-caused bubbles do not form and migrate to a surface of the media resistant material exposed to the environment.

20. The device as recited in claim 9, wherein the media resistant material is resistant to any corrosive element contained within the media that is corrosive to the bubble restrictor material.

* * * * *